United States Patent [19]

Hammond

[11] Patent Number: 4,744,004

[45] Date of Patent: May 10, 1988

[54] ELECTRICITY METER WITH SOLID-STATE CIRCUITS

[75] Inventor: Scott H. Hammond, Columbus, Ohio

[73] Assignee: Transdata, Inc., Tyler, Tex.

[21] Appl. No.: 54,629

[22] Filed: May 27, 1987

[51] Int. Cl.$^4$ .............................................. H02B 9/00
[52] U.S. Cl. .................................... 361/372; 324/156; 364/483; 361/424
[58] Field of Search ...................... 324/156, 141, 142; 174/35 R, 35 MS; 364/483, 703; 200/50 AA; 361/424, 364, 366, 368, 372–375

[56] References Cited

U.S. PATENT DOCUMENTS

| | | | |
|---|---|---|---|
| 4,110,814 | 8/1978 | Britton | 324/156 |
| 4,163,939 | 8/1979 | Halstead | 324/156 |
| 4,408,283 | 10/1983 | Kovalchik | 364/483 |
| 4,571,691 | 2/1986 | Kennon | 364/483 |
| 4,615,009 | 9/1986 | Battocletti | 364/483 |
| 4,630,211 | 12/1986 | Pettis | 364/483 |

*Primary Examiner*—G. P. Tolin
*Attorney, Agent, or Firm*—Mueller and Smith

[57] ABSTRACT

Metering apparatus which employs a structure conforming to long accepted industrial standards but which is adapted to meet the requirements for highly versatile solid-state meter circuits having a multitude of outputs both in terms of electrical signals and visual display. The meter structure is provided an EMF and RF barrier coupled to through the interconnection of the meter cover to neutral reference. Further, a key actuated switching input is provided through the cover face of the meter with the use of a pattern of contact surfaces positioned on the inner surface of the face. These surfaces cooperate with spring biased contacts arranged to achieve proper contact with them when the meter cover is rotated into its latched orientation. A separate terminal block is provided which is coupled through a multi-lead connector to the meter circuit and which provides discrete individual terminal outputs readily wired by utility personnel trained in the use of older mechanical metering systems.

16 Claims, 3 Drawing Sheets

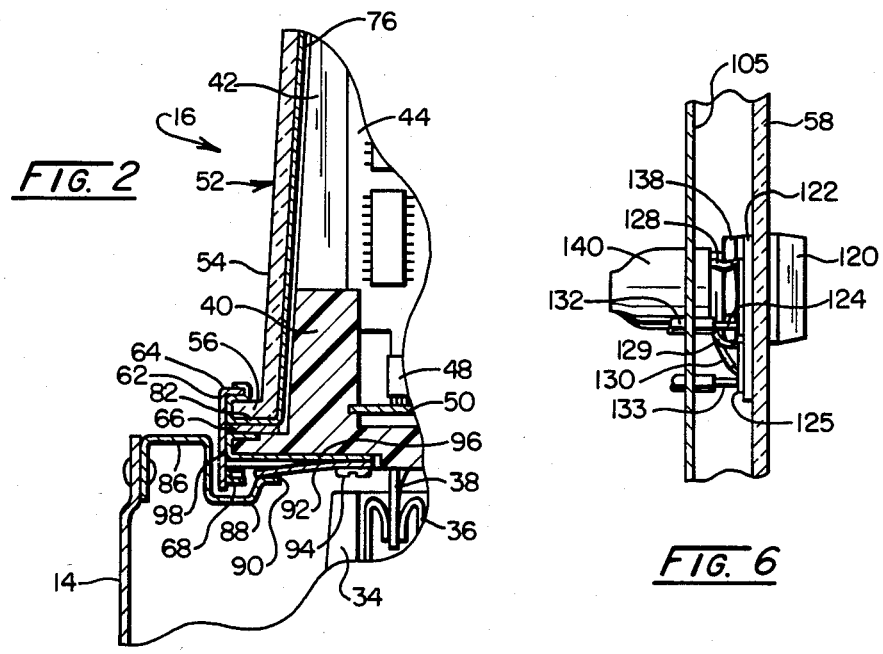
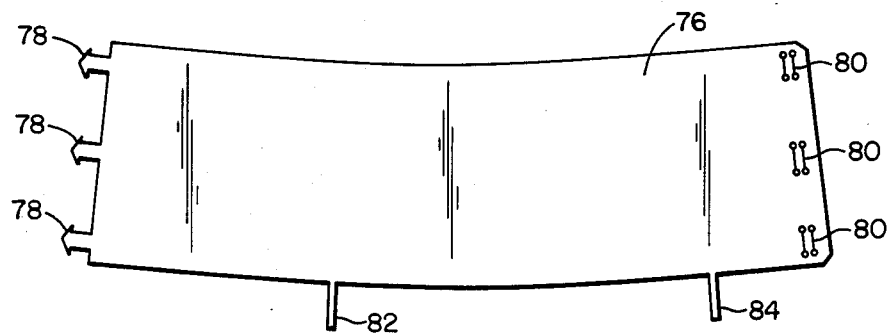

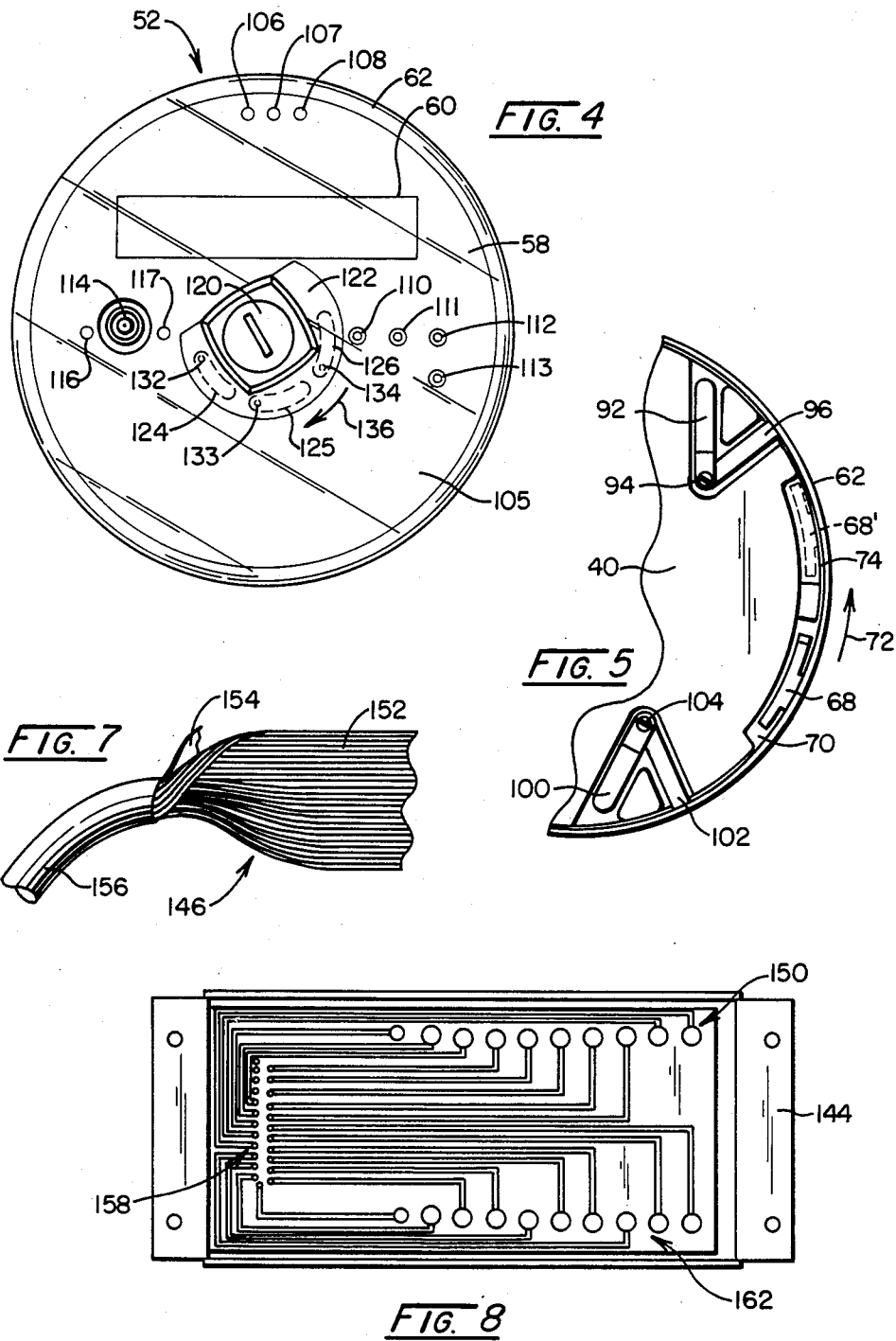

ELECTRICITY METER WITH SOLID-STATE CIRCUITS

BACKGROUND

As electrical power was introduced communities with the formation of the electrical power industry, standards commenced to be developed for distributing and metering equipment both for the convenience of the industry and the safety of the consumer. One such standardization evolved in conjunction with electricity meters. Traditionally, these devices measured the singular electrical parameter, kilowatthours, and were and continue to be fabricated as mechanical devices incorporating inductively rotated disks and mechanically driven readout dials which are read periodically by utility personnel. Positioned on an outside wall surface of a dwelling or commercial facility, the meters typically are supported from a sealed metal enclosure or box within which is mounted a relatively large receiving socket having a plurality of spring-biased jaws in a standardized configuration designed to receive and support the outwardly extending contact blades of a meter base. The meter mechanism is supported from the opposite side of that base and is protected by a clear glass or plastic cover. This cover permits utility personnel to observe the mechanical movement of the meter components, thus providing a modicum of assurance as to their performance. To provide for safety, the metering components traditionally have incorporated lightning arresters and the entire installation is coupled with a conductive path including the socket and the metal enclosures extending to earth ground.

As metering technology has advanced, devices providing mechanically derived single parameter outputs, such as kilowatthours, are being supplanted by more advanced, solid-state electronic meters providing multi-parameter outputs both as visual readouts and as electrical signals which are transmissible to centralized data collection and treatment facilities. The multi-function output meters are particularly desired by industrial consumers, as well as the utilities and provide a sequence of outputs, for example, as a timed scrolling arrangement developing a broad range of parameter information. Of the parameters industry will select, for example, are watthour, varhour, Qhour, volt$^2$hour, volthour, ampere$^2$hour, amperehour, and volt amperes. Additionally, watt, var, Q, ampere, and volt functions may be utilized in a variety of combinations. In this regard, reference is made to U.S. Pat. No. 4,615,009 by Battocletti and Hammond, entitled "Electronic Energy and Power Monitoring Apparatus", issued Sept. 30, 1986.

Notwithstanding the significantly enhanced performance and expanded measurement capabilities of modern metering systems, such systems still are called upon to conform to the standardized earlier packaging and mounting procedures, both to assure a desirable universality and for reasons of power distribution safety. Thus, the modern electronic meter is mounted upon the large blade and jaw socket and is packaged in a clear glass or plastic cover extending from the sealed metal mounting box coupled to earth ground. Such packaging is not conducive to solid-state circuitry. Accepted materials for which the socket-meter structures are fabricated conventionally are black thermosetting plastics selected for strength, dielectric characteristics and flame retardation function. However, the materials so elected from requirements of the past also contribute to the development of heat within the clear enclosures which, when protecting mechanical metering produce no adverse effect. On the other hand such elevated temperatures adversely affect meters employing solid-state circuit components. Particularly where such components as EPROMS are employed, which is often the case, ultraviolet radiation also will have an adverse effect on the circuits over the long term. Additionally, such circuits become vulnerable to the effects of electromagnetic interference (EMI) and radio frequency interference (RFI) and, in some cases, will be seen to generate RFI types of noise where the circuits are digital in function. For example, where digital phase shifting and/or correction is carried out as described in U.S. Pat. No. 4,408,283, clock frequencies of about 11 megaHertz will be employed which may constitute a form of RFI without proper shielding.

In part because of the larger electrical parameter measurement capabilities of solid-state circuit meters, it is desirable to provide switching access to them on the part of utility personnel without disturbing the integrity of the meter seal formed by the cover and mounting box. In the past, such access has been achieved with levers and the like which were in one manner or another extensible through the glass cover structure, with security provided by keys or the like. Modern solid-state meter structures, however, require additional inputs of this hand actuable nature. For example, it is desirable to develop a form of control over the scrolled outputs of liquid crystal display (LCD) readouts and the like such that they can be stopped or "rewound" to an initial readout. Difficulties of meter handling also arise in adapting old, standardized, encasing techniques to modern electronics. Typical utility personnel are not familiar with the multi-pin connectors of digital-data conveyance systems and similar very delicate structures. As a consequence, when such couplings and the like are combined with the relative massive socket structures and the outdoor environment of a meter, damage to the former is often the result of meter changing procedures and the like.

SUMMARY

The present invention is addressed to electrically metering devices which, while incorporating solid-state circuit components that exhibit, when unprotected, vulnerability to environmental effects, employs metering support structures which remain familiar to utility personnel and which conform to long-established electrical power industry standards. In this regard, while transparent covers formed of glass or plastic are maintained as in the past, barrier structures interconnected with the meter structure paths to neutral reference or ground are provided to block EMI and RFI noise impinging upon the meter as well as any RFI effects generated by the enclosed solid-state circuit. These barrier structure also function to reflect sunlight and attendant heat generation as well as UV effects.

To achieve limited and protected external access to the circuitry of the meter, a key actuated switching technique is employed wherein the switch structure extends through the transparent meter cover forward face and is in a slideable contact with outwardly-biased switch contact components. With the arrangement, as the meter cover is moved from its unlatched to its latched position, contact is automatically established without need to resort to the delicate wiring techniques required of modern electronics. In this same regard, while multi-lead ribbon electrical connections are required for the advanced circuits of the meter, an arrangement is provided for developing a terminal block output which can be wired in the fashion familiar to utility personnel using relatively rugged screwdrivers and similar common implements.

Another feature of the invention is to provide an electricity meter which includes a housing having a conductive path to a neutral reference. A fixed socket component is supported upon this housing and is connectable with a monitored source of power. A meter socket component having electrical connectors removably connectable with the fixed socket component having a circular base connector portion as well as a meter support portion also is provided such that a solid-state meter circuit may be supported upon the latter portion. The solid-state meter is electrically coupled with the meter socket component electrical connectors for evaluating the source of power and providing electrical parameter outputs including a visual readout display forwardly disposed from the base connector portion. An electrically-insulative, transparent cover having a generally cylindrical body portion extending from a circular rearward edge portion to a forwardly-disposed face is positionable over the meter circuit to effect the enclosure thereof while providing visual access to the visual readout through the forwardly-disposed face. An electrically conductive ring connector is positionable over the cover circular rearward edge and is rotatably engageable with the meter socket for coupling the cover thereto. Within the transparent cover there is provided an electrically conductive metallic barrier which is located adjacent the generally cylindrical body portion and functions to reflect sunlight as well as dissipate electromagnetic field and radio frequency phenomena. To achieve the latter, a first electrical conductor arrangement for electrically coupling the barrier with the ring connector is provided. Then, a second electrical conducting arrangement is coupled with the meter socket component to effect electrical connection between the ring connector and the housing path to neutral reference when the cover and ring connector are mounted upon the meter socket component base connector portion and the meter socket component is connected with the fixed socket component.

Another feature of the invention is to provide an electricity meter for mounting upon a housing carrying a fixed socket component connectable with a monitored source of power. A meter socket component having electrical connectors removably connectable with the fixed socket component is provided which has a circular base connector portion incorporating latch components and a meter support portion extending therefrom. A solid-state meter circuit is supported upon the meter socket component meter support portion and is electrically coupled with the electrical connectors for evaluating the source of power and providing electrical power parameter outputs including a visual readout display at a readout region forwardly disposed from the meter socket component. The circuit is responsive to switched inputs to carry out corresponding predetermined circuit operation functions. A plurality of switch terminals are mounted in the vicinity of the readout region, each electrically coupled with the circuit and each including an outwardly biased electrically conductive contact point and being mutually position to define a pattern of such contact points. An electrically insulative cover is provided having a generally cylindrical body portion extending from a circular rearward edge portion to a forwardly disposed face. The circular rearward portion is positionable adjacent the meter socket component circular base connector portion to position the body portion over the meter circuit to effect enclosure thereof while providing visual access to the display. An annular connector is mounted upon the cover circular rearward edge and is rotatable therewith from release to latch positions to effect attachment with the meter socket component by latching engagement with the meter socket component latch components. A plurality of electrical contact surfaces are mounted internally with the cover at the face thereof, these contact surfaces being mutually spaced in a contact surface pattern corresponding with the contact point pattern such that each contact surface effects a continuous slideable contact with a corresponding contact point when the cover is moved from its release to latch positions. A key actuated switch is mounted upon and extends through the cover face and is electrically couple with the contact surfaces as well as being actuable to multiple positions to effect switched interconnections of select ones of the contact surfaces to derive the meter circuit switch inputs.

Other objects of the invention will, in part, be obvious and will, in part, appear hereinafter.

The invention, accordingly, comprises the apparatus possessing the construction, combination of element, and arrangement of parts which are exemplified in the following disclosure.

For a fuller understanding of the nature and objects of the invention, reference should be had to the following detailed description taken in connection with the accompanying drawings.

BRIEF DESCRIPTION OF THE DRAWINGS

FIG. 2 is a partial sectional view taken through the plane 2—2 in FIG. 1;

FIG. 3 is a plan, developed view of a barrier employed with the apparatus of FIG. 1;

FIG. 4 is a front view of the face of the meter shown in FIG. 1 with the cover in an unlatched orientation;

FIG. 5 is a partial rear view of the cover and meter socket component of the apparatus of FIG. 1;

FIG. 6 is a partial side view of the key actuated switch of the apparatus of FIG. 1;

FIG. 7 is a partial view of a multi-lead connector employed with the meter of FIG. 1; and FIG. 8 is a rear view of a terminal block employed with the meter of FIG. 1.

DETAILED DESCRIPTION OF THE INVENTION

Figure 1:
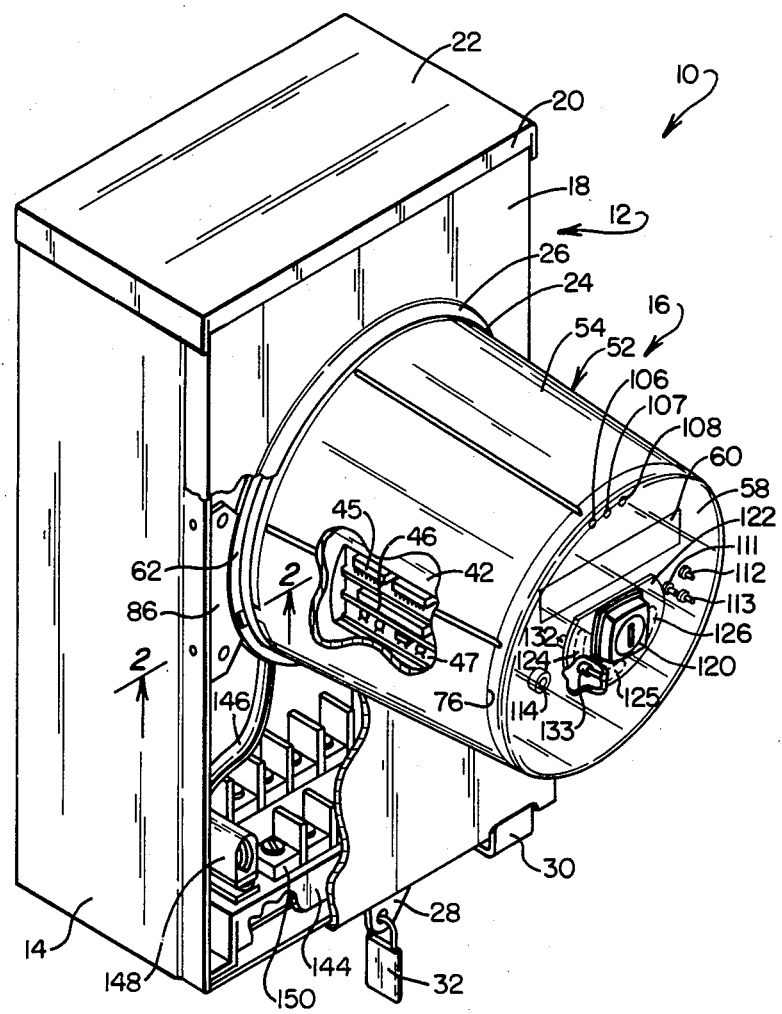
FIG. 1 is a perspective view of an electricity meter according to the invention with portions broken away to reveal internal structure.

Referring to FIG. 1, a meter assembly is represented generally at 10. The assembly 10 is, in terms of outer appearance, exhibits standard structuring including a rugged steel housing 12 having a basic box shaped open front compartment 14 and which is rigidly attached to a dwelling or commercial establishment and into which power leads are directed. Additionally, this housing 12 with compartment 14 is coupled to a neutral reference such as earth ground in accordance with industry standards. Other housing are employed with the meters, for example, switch gear cabinets. Compartment 14 retains a multiple jaw fixed socket into which the power lines or their derivatives being monitored are coupled which, conventionally, is formed of a rugged material such as a gray porcelain or the like and which functions to support the outwardly extending meter assembly represented generally at 16. To assure the integrity of the assembly while affording limited and secure access to the assembly 10, a front face plate 18 is providing having one end which is positionable beneath a downwardly extending edge 20 of the top portion 22 of compartment 14. A circular aperture or opening 24 is provided within face plate 18 having an outwardly extending conforming bezel 26 which fits over the meter assembly 16 when the cover is positioned upon compartment 14. To retain the cover in position, a latch is provided at 28 which is actuated by lever 30 and which is sealed upon installation by a lead seal as at 32. Thus, the meter assembly 16 cannot be removed unless the seal 32 is removed and the lever 30 is pulled downwardly to permit removal of face plate 18.

Looking additionally to FIG. 2, the coupling of the meter 16 is depicted. In the latter figure, the fixed socket positioned within compartment 14 is represented at 34. Socket 34 incorporates a plurality, for example, 13 resilient jaws, one of which is revealed at 36. These jaws transmit monitored power which, in many installations, will be stepped down by external transformers, into the meter by virtue of the coupling of the meter therewith through "stab", one of which is revealed at 38 extending into jaw 36. The meter assembly 16 is entirely supported from the stab 38-jaw 36 combination and in a typical installation, the assembly 16 is maneuvered up and down and inwardly to effect a connection. Conversely, when the meter assembly 16 is removed it is grasped by the operator and manipulated up and down and outwardly. Stabs 38 extend from a meter socket component base connector portion 40. Component 40 is formed of the earlier-noted rigid black thermosetting plastic materials and has a circular peripheral configuration. The base 40 is integrally formed with and extends outwardly to provide a meter support portion 42 within which a sequence of horizontally disposed printed circuit boards are provided as represented at 44 and 45–47 (FIG. 1). These boards 44–47 are in electrical communication by virtue of their insertion within multi-lead connectors as at 48 coupled, in turn, to a vertically oriented inter-associative printed circuit board 50 supported at the meter socket portion 40. Board 50 often is referred to as a "mother board" and is in electrical communication with the array of stabs as at 38 extending from the base connector portion 40.

The solid-state circuitry within the meter assembly 16 is enclosed by a transparent cover 52 having a generally cylindrical or frustoconical body portion 54 extending from an annular ridge 56 (FIG. 2) to a face 58 (FIG. 1) through which a liquid crystal display 60 (FIG. 1) may be observed. Cover 52 may be formed of glass or a clear plastic such as that marketed under the trademark "Lexan" and is retained upon the meter socket base connector portion 40 by a metal annular ring 62. As seen in FIG. 2, ring 62 has an upwardly disposed and inwardly depending rim portion 64 which is positioned in retaining fashion over the corresponding ridge 56 of cover 52. The rim 62 is retained upon cover 52 by an adhesive and there also is included in annular gasket 66 functioning to secure the assemblage against weather. In order to permit removable connection between the ring 62-cover 52 assembly and the socket portion 40, three spring biased latched components are coupled with the ring 62, one of which is shown in FIGS. 2 and 5 at 68. Looking to the latter figure, the circular base connector portion 40 of the meter socket again is reproduced and is seen to incorporate arcuate openings as at 70 about its periphery positioned with respect to the latches 68 such that a resilient bayonet form of connection may be achieved. In this regard, the operator positions the cover 52 over the base portion 40 in an orientation where the latch 68 falls within the opening 70. This is a release orientation. The assemblage of cover 52 and ring 62 then is rotated in the direction represented at arrow 72 until the latch as at 68 has the orientation represented in phantom at 68' wherein the resilient tines extending therefrom are biased against an inwardly disposed ledge 74 of the base connector portion 40.

FIGS. 1 and 2 reveal that internally disposed within the body portion 54 of cover 52 there is positioned a thin barrier 76 functioning to dissipate RF and EMF noise as well as to reflect sunlight including deleterious UV radiation. Preferably formed of an aluminum foil, for example, having a thickness of about 0.002 in. and being coated with a protective insulative coating formed, for example, of mylar having a thickness of 0.002 in. on each side, the barrier 76 is configured in development such that it assumes the earlier-noted frustoconical shape of the body portion 54. In this regard, reference is made to FIG. 3 wherein the barrier is shown in developed form being conformable into the noted generally cylindrical shape by the insertion of tabs 78 into corresponding dual slots 80. It may be noted, however, that two tabs 82 and 84 are integrally formed with and extend from the barrier 76 for the purpose of establishing a connection with ground reference. Looking to FIG. 2, this path is provided initially by removing the insulative coating from the tabs 82 and 84 and effecting a contact between the tabs and the electrically conductive ring 62. FIG. 2 reveals that tab 82 is wrapped about the ridge 56 of cover 52 and thence about the rim 64 of ring 62. thus, a compressive electrical association is developed between the barrier 76 and the ring 62. The electrical path to ground is continued through an association with a ground strap or ear conventionally associated with meter housings at 12. FIGS. 1 and 2 show such a ground strap at 86 fixed to the compartment 14 and configured having an arcuate channel 88 into which the ring 62 is nested when the meter 16 is installed. The strap 86 further provides a reference contact surface 90 which, as shown in FIG. 2, is contacted electrically by a resilient conductor 92 fixed to the meter base connector portion 40 by a screw connection 94. Components 92 and 94 additionally are seen in FIG. 5 and, further, extend by an electrically conductive connector strap 96 also coupled to base 40 at screw connection 94. Strap 96 extends as shown in FIG. 2 to an outwardly biased resilient, U-shaped contact portion 98 which is in biased contact against the inside surface of ring 62. With the arrangement shown, as the meter assembly 16 is pushed into contact and supportive association with the fixed socket 34, resilient conductor or contactor 92 is moved into contact with the reference contact surface 90 of ground strap 86. Consequently, an electrical path to neutral reference or ground is established into the ring 62 and thence, to the barrier 76 to provide protection against EMF and RF noise. Such noise is increasingly encountered in modern industrial installations, for example at substations where transforming functions are extensively carried out. Any noise generated by the circuits of the meters themselves also is blocked by the barrier. For example, unless properly shielded, such noise may be developed from the clock frequencies of digital phase shifters as described in earlier-noted U.S. Pat. No. 4,408,283 employing frequencies of about 11 megaHertz. FIG. 5 shows a second contactor arrangement for associating the electrically conductive ring 62 with a second strap symmetrically disposed upon the compartment 14. the conductive path components include a resilient contact or a conductor 100 combined in association with an electrical strap making biased contact with the inner surface of ring 62 and retained in position by a screw 104 fastened to base portion 40.

Returning to FIG. 1, the face 58 of cover 52 is seen to permit visual access not only to the LD display 60 but also to potential indicators provided as three, phase designated light emitting diodes (LEDs) 106-108. The face plate of the meter itself is shown at 105 in FIGS. 1, 4, and 6, which typically provide printed data with respect to the various components extending therethrough from the circuit. As shown additionally in FIG. 4, when the cover 52 is removed, the meter may be accessed with respect to a sequence of switches for carrying out such functions as reset, set, test/advance and hold as represented at push-button switches 110-113. Additionally, a test jack is provided as at 114 along with load rate and hold mode LED output indicators shown respectively at 116 and 117.

Because the solid-state meter circuit at hand enjoys a very substantial output capacity in terms of parameter evaluation readout, the display 60 presents such readouts in a sequential or scrolling manner over a period of time. Thus, it is desirable to provide a switching input to the circuit by way of external control without disturbing the sealed meter assembly. For example, it may be desirable to return the display to an initial readout or to hold a given readout until the operator has completed servicing. However, space at the face 58 of the cover 52 is quite limited and the development of delicate electrical contacts with an arrangement wherein the cover 52 is required to be removed from time to time, poses difficulties. With the arrangement of the invention, a single pole double throw momentary switch function is achieved using three electrical connections and a key accessed switch actuation feature. In this regard, the key actuated switch may be provided, for example, as a type SKT65EG manufactured by Alcoswitch Electronic Products, Inc., North Andover, Mass. Such switch is shown at 120 in FIGS. 1, 4, and 6 as mounted upon the face 58 of cover 52. On the inwardly-disposed surface of face 58 there is positioned a circuit board 122 which carries three kidney shaped metal contact surfaces 124-126 which are coupled to the three-lead output of switch 120 as shown, for example, at leads 128 and 129 in FIG. 6. These contact surfaces 124-126 are so positioned in a pattern that, when the cover 52 is installed, they are in electrical contact with the spring biased thin rounded ends or points of three corresponding contactors supported from the printed circuit components. The contacts are shown in FIG. 4 at 132-134, contacts 132 and 133 being seen in FIGS. 1 and 6. FIG. 4 also reveals that when the cover 52-ring 62 assembly is in the earlier-noted release orientation as shown in FIG. 5, the contacts will be positioned as represented in FIG. 4 at one end of each of the contact surfaces 124-126. As the cover then is rotated in the sense of arrow 72 shown in FIG. 5 and arrow 136 as shown in FIG. 4, the contacts 132-136 will move into a centered location upon respective contact surfaces 124-126. Generally, the contacts are plated with gold to improve electrical conductivity between these components. With the arrangement shown, the operator need only push and turn the cover 52-ring 62 assemblage in the process of installation to achieve effective communication between switch 120 and the circuitry of the meter. It may be observed in FIG. 6 that the switch 120 is retained in place along with circuit board 122 by a nut 138 threadably engaging the rearwardly extended body portion of the switch shown at 140. To accommodate for this body portion, an opening is made in the face plate 105 of the meter such that the body portion 140 will extend into but not in contact with circuit components.

The circuit of meter 16 further is called upon to carry out a communicative function in view of its significantly expanded capabilities. This requires a multi-lead output providing, inter alia, telephonic communication or inputs to any of a variety of data collection systems. In conventional mechanical metering devices which are housed in assemblages such as 10, only conventional KYZ type relay outputs were provided and these were accommodated for with the stab and jaw assemblage of the sockets associated with the meter. Current circuits, however, will require, for example, up to 25 output leads which must be manipulated by personnel not familiar with the delicate types of connectors associated with digital data structures and the like. To accommodate for this situation, the assemblage 10 also includes a terminal block shown within compartment 14 at 144 which is associated with the meter output by multi-lead cable 146 extending thereto through a conventional multi-lead connector 148. The output or inputs of the block 144 then are provided as a series of easily accessed screw fastener type terminals as represented generally at 150. These terminals are readily used by personnel familiar with such larger implements and discrete wire connections. The conduit 146 is provided as, for example, a 25-lead ribbon cable. Looking momentarily to FIG. 7, the cable 146 is seen to be formed as flat multi-lead ribbon component 152 which s covered with a copper/tin shield 154 and retained within an insulative jacket 156. Preferably, the cable 146 is about 18 inches in length so that the block 144 may be mounted at a convenient side location where the meter 16 is, in turn, mounted in larger cabinetry such as is found in conventional switch gear installations. Looking to FIG. 8, the distribution of leads from the connector 148 is shown as emanating from multiple connections 158 extending to connector 148 and which, in turn, lead to the individual terminals 150 via the printed circuitry represented at terminal arrays 160 and 162.

Since certain changes may be made in the above-described apparatus without departing from the scope of the invention herein involved, it is intended that all matter contained in the description thereof or shown in the accompanying drawings shall be interpreted as illustrative and not in a limiting sense.

What is claimed is:

1. An electricity meter, comprising:
    housing means including a condutive path to a neutral reference;
    fixed socket component means supported upon said housing means and connectable with a monitored source of power;

meter socket component means having electrical connectors removably connected with said fixed socket component means, having a circular base connector portion and a meter support portion extending therefrom;

a solid-state meter circuit supported upon said meter support portion and electrically coupled with said meter socket component means electrical connectors for evaluating said source of power and providing electrical parameter outputs including a visual readout display forwardly disposed from said base connector portion;

an electrically insulative, transparent cover having a generally cylindrical body portion extending from a circular rearward edge portion to a forwardly disposed face and positioned over said meter circuit to effect the enclosure thereof while providing visual access to said visual readout through said forwardly disposed face;

electrically conductive ring connector means positioned over said cover circular rearward edge and rotatably engageable with said meter socket means for coupling said cover thereto;

electrically conductive metallic barrier means positioned within said cover adjacent said generally cylindrical body portion for reflecting sunlight, and dissipating electromagnetic field and radio frequency phenomena;

first electrical conducting means for electrically coupling said barrier means with said ring connector means;

second electrical conducting means coupled with said meter socket component means and effecting electrical connection between said ring connector means and said housing means path to a neutral reference with said cover and ring connector portion and said meter socket component means connected with said fixed socket component means.

2. The electricity meter of claim 1 in which said barrier comprises a sheet of aluminum foil supported by a flexible electrically insulative plastic layer.

3. The electricity meter of claim 2 in which said first electrical conducting means comprises a tab integrally formed with said aluminum foil sheet and extending from said barrier, said tab being positioned over said cover circular rearward edge for contact with said electrically conductive ring connector means when said ring connector means is positioned over said cover annular rearward edge.

4. The electricity meter of claim 1 in which:
said housing means inludes a reference contact surface coupled with said electrical path and mounted adjacent said fixed socket component means; and
said second electrical conducting means includes a first resilient conductor extending from said meter socket component means base connector portion to effect abutting contact with said electrically conductive ring connector, and a second resilient conductor electrically coupled with said first resilient conductor and movable into electrical contact with said reference contact surface when said meter socket component means is connected with said fixed socket component means.

5. The electricity meter of claim 1 in which:
said solid-state meter circuit provides said parameter outputs at multi-temrinal communications ports; and
including terminal block means mounted within said hosuing for providing a plurality of screw connector terminals corresponding with said multi-terminals of said communications port; a multi-pin connector mounted upon said terminal block means; distribution circuit means for connecting each said pin of said multi-pin connector with a said screw connector terminal; and elongate multi-lead flexible ribbon cable coupled in signal exchange relationship between said muli-terminal communications port and said multi-pin connector.

6. The electricity meter of claim 5 in which said ribbon cable is folded and wrapped with a conductive groundable shield and insulative wrapping material to form a flexible cable of generally circular cross section.

7. An electricity meter mounted upon a housing carrying a fixed socket connectable with a monitored source of power, comprising:

a meter socket component having electrical connectors removably connected with said fixed socket component and having a circular base connector porion incorporating latch comopnents and a meter support portin extending therefrom;

a solid-state meter circuit supported upon said meter socket component meter support portion and electrically coupled with said electrical connectors for evaluating said source of power and providing electrical power parameter outputs including a visual readout display at a readout region forwardly disposed from said meter socket component, said circuit being responsive to switched inputs to carry out corresponding predetermined circuit operation functions;

a plurality of switch terminals mounted in the vicinity of said readout region, each electrical coupled with said circuit, each including an outwardly biased electrically conductive contact point, and being mutually positioned to define a pattern of said contact points;

an electrically insulative cover having a generally cylindrical body portion extending from a circular rearward edge portion to a forwardly disposed face, said circular rearward postion being positioned adjacent said meter socket component ciruclar base connector portion to position said body portion over said meter circuit to effect the enclosure thereof while providing visual access to said display;

annular connector means mounted upon said cover circular rearward edge and rotatable therewith from release to latched positions to effect attachment with said meter socket component by latching engagement with said meter socket component latch components;

a plurality of electrical contact surfaces mounted internally with said cover at said face, said contact surfaces being mutually spaced in a contact surface pattern corresponding with said contact point pattern such that each said contact surface effects a continuous slideable contact with a correspoding contact point with said cover moved from said releast to said latched positions; and key actuated switch means mounted upon and extending through said cover face, electrically coupled with said contact surfaces and actuable to multiple positions to effect switched interconnections of selectones of said contact surfaces to derive said meter circuit switched inputs.

8. The electricity meter of claim 7 in which each said switch terminal contact point is configured as a spring biased rod extending outwardly a distance selected to assure contact with a said contact surface when said cover is mounted upon said meter socket component and said annular connector means is in said latched position.

9. The electricity meter of claim 7 in which said key actuated switch means is a single pole, double throw momentary switch and said contact surfaces represent two normally open terminals and one common terminal of said switch.

10. The electricity meter of claim 7 in which:
said cover is transparent;
including electrically conductive metallic barrier means positioned within said cover adjacent said generally cylindrical body portion for reflecting sunlight and dissipating electromagnetic field and radio frequency phenomena; and
electrically conductive path means for coupling said barrier with a neutral reference.

11. The electricity meter of claim 7 in which:
said solid-state meter circuit provides said parameter outputs at a multi-terminal communications port; and
including terminal block means mounted within said housing for providing a plurality of screw connector terminals corresponding withsaid multi-terminals of said communications port; a multi-pin connector mounted upon said terminal block means; distribution circuit means for connecting each said pin of said multi-pin connector with said screw connector terminal; an elongate multi-lead flexible ribbon cable coupled in signal exchange relationship between said multi-terminal communications port and said multi-pin connector.

12. The electricity meter of claim 11 in which said ribon cable is folded and wrapped in an insulative wrapping material to form a flexible cable of generally circular cross section.

13. An electricity meter mounted with a housing including a conductive path to a neutral reference and connected with a monitored source of electrical power, comprising:
fixed socket component means supported upon said housing and connectable with said monitored source of electrical power;
meter socket component means having electrical connectors removably connected with said fixed socket component means, having a circular base connector portion and a meter support portion extending therefrom;
a meter circuit having solid-state components supported upon said meter socket component means meter support portion and electrically coupled with said electrical connectors for evaluating said source of power and providing electrical power parameter outputs including a visual readout display at a readout region forwardly disposed from said meter socket component, said circuit being responsive to switched inputs to carry out corresponding predetermined circuit developed operations;
three switch terminal mounted at said readout region, each electricaly coupled with said circuit, each including an outwardly extending, outwardly biased, electrically conductive contact point;
an electrically insulative transparent cover having a generally cylindrical body portion extending from a circular rearward edge portion to a forwardly disposed face, said circular rearward edge being positioned adjacent said meter socket component means circular base connector portion to position said body over said meter circuit to effect enclosure thereof;
electrically conductive ring connector means mounted upon said cover at said circular rearward edge and rotatable therewith from release to latched positions to effect attachment with said meter socket component circular base connector portion;
an electrically conductive barrier comprising an aluminum foil sheet supported by a flexible plastic layer positioned within said cover adjacent said generally cylindrical body portion and having an integrally formed conductive tab secured in electrically conducting relationship with said ring connector means;
three discrete electrical contact surfaces mounted internally upons aid cover at said face, said contact surfaces being mutually spaced in correspondence with said contact points such that each said contact surface effects a continuous slidable contact with a corresponding contact point said cover moved from said release to said latched positions;
key actuated momentary, single pole, double throw switch means mounted upon and extending through said cover face, electrically coupled with said contact surfaces and actuable to derive said meter circuit switched inputs; and
electrical conducting means in resilient contact with said ring connector and mounted to said meter socket component means for forming a conductive path therefrom to said neutral reference.

14. The electricity meter of claim 13 in which each said switch terminal contact point is configured as a spring biased rod extending outwardly a distance selected to assure contact with a said contact surface when said cover is mounted upon said meter socket component and said ring connector means is in said latched position.

15. The electricity meter of claim 13 in which:
said solid-state meter circuit provides said parameter outputs at a multi-terminal communications port; and
including terminal block means mounted within said housing for providing a plurality of screw connector terminals corresponding with said multi-terminals of said communications port; a multi-pin connector mounted upon said terminal block means; distribution circuit means for connecting each said pin of said multi-pin connector with a said screw connector terminal; an elongate multi-lead flexible ribbon cable coupled in signal exchange relationship between said multi-terminal communications port and said multi-pin connector.

16. The electricity meter of claim 15 in which said ribbon cable is folded and wrapped with an insulative wrapping material to form a flexible cable of generally circular cross section.

* * * * *